US012733372B2

(12) United States Patent
Yu et al.

(10) Patent No.: US 12,733,372 B2
(45) Date of Patent: Sep. 8, 2026

(54) DISPLAY SUBSTRATE AND METHOD OF MANUFACTURING DISPLAY SUBSTRATE

(71) Applicants: Yunnan Invensight Optoelectronics Technology Co., Ltd., Kunming (CN); BOE Technology Group Co., Ltd., Beijing (CN)

(72) Inventors: Zhongxiang Yu, Beijing (CN); Zongshun Yang, Beijing (CN); Chao Yang, Beijing (CN); Hongtao Yu, Beijing (CN); Kuanta Huang, Beijing (CN); Xiaochuan Chen, Beijing (CN); Qingshan Shan, Beijing (CN); Dongdong Su, Beijing (CN); Ruquan Li, Beijing (CN); Jianming Zou, Beijing (CN); Shipeng Li, Beijing (CN); Yunhao Zhang, Beijing (CN); Lei Fang, Beijing (CN); Xueliang Zhu, Beijing (CN); Xiong Yang, Beijing (CN); Ao Li, Beijing (CN); Fushuang Zhang, Beijing (CN); Jixing Wang, Beijing (CN)

(73) Assignees: Yunnan Invensight Optoelectronics Technology Co., Ltd., Kunming (CN); BOE Technology Group Co., Ltd., Beijing (CN)

( * ) Notice: Subject to any disclaimer, the term of this patent is extended or adjusted under 35 U.S.C. 154(b) by 180 days.

(21) Appl. No.: 18/809,226

(22) Filed: Aug. 19, 2024

(65) Prior Publication Data

US 2024/0414977 A1 Dec. 12, 2024

Related U.S. Application Data

(63) Continuation of application No. 18/556,396, filed as application No. PCT/CN2023/070083 on Jan. 3, 2023.

(51) Int. Cl.
*H10K 59/80* (2023.01)
*H10K 59/12* (2023.01)
(Continued)

(52) U.S. Cl.
CPC ... *H10K 59/80517* (2023.02); *H10K 59/1201* (2023.02); *H10K 59/122* (2023.02);
(Continued)

(58) Field of Classification Search
CPC ......... H10K 59/80517; H10K 59/1201; H10K 59/122; H10K 59/123; H10K 71/60;
(Continued)

(56) References Cited

U.S. PATENT DOCUMENTS

2024/0065086 A1* 2/2024 Chen ................ H10K 59/80522

* cited by examiner

*Primary Examiner* — Kevin Quarterman
(74) *Attorney, Agent, or Firm* — Westman, Champlin & Koehler, P.A.

(57) ABSTRACT

A display substrate and a method of manufacturing the display substrate are provided. The display substrate includes a base substrate and a plurality of sub-pixels. A first electrode of a light-emitting element of the sub-pixel includes: a first conductive layer electrically connected to a source or a drain of a driving transistor of the sub-pixel; a second conductive layer; and a transparent material layer. The transparent material layer includes a first transparent material sub-layer and a second transparent material sub-layer, the first transparent material sub-layer is between the second transparent material sub-layer and the second conductive layer, the second transparent material sub-layer covers the first transparent material sub-layer, and an edge of the first transparent material sub-layer is aligned with an edge of the second conductive layer.

20 Claims, 11 Drawing Sheets

(51) Int. Cl.
*H10K 59/122* (2023.01)
*H10K 59/123* (2023.01)
*H10K 71/60* (2023.01)
*H10K 102/00* (2023.01)
*H10K 102/10* (2023.01)

(52) U.S. Cl.
CPC ........... *H10K 59/123* (2023.02); *H10K 71/60* (2023.02); *H10K 2102/103* (2023.02); *H10K 2102/351* (2023.02)

(58) Field of Classification Search
CPC ....... H10K 2102/103; H10K 2102/351; H10K 59/124; H10K 50/816; H10H 29/10
See application file for complete search history.

DISPLAY SUBSTRATE AND METHOD OF MANUFACTURING DISPLAY SUBSTRATE

CROSS REFERENCE TO RELATED APPLICATION(S)

This application is a continuation of application Ser. No. 18/556,396 filed on Oct. 20, 2023, which published as US 2024/0268186 A1, entitled "DISPLAY SUBSTRATE AND METHOD OF MANUFACTURING DISPLAY SUBSTRATE", which is a Section 371 National Stage Application of International Application No. PCT/CN2023/070083, filed on Jan. 3, 2023, entitled "DISPLAY SUBSTRATE AND METHOD OF MANUFACTURING DISPLAY SUBSTRATE", which are incorporated herein in entirety by reference.

TECHNICAL FIELD

The present disclosure relates to a field of display technologies, and in particular to a display substrate and a method of manufacturing the display substrate.

BACKGROUND

A micro-display such as a Micro-OLED is widely used as a near-eye display in various fields, such as a field of VR/AR. A sub-pixel of the display has a basic structure of anode+light-emitting layer+cathode. An anode emitting layer provides a hole, while the cathode provides an electron. The hole and the electron are combined in the light-emitting layer to form an exciton, which excites the light-emitting layer to emit light. With the increasing demand for high brightness, low power consumption, high color gamut, and long lifespan of products, it is a challenge to provide a sub-pixel with an anode that meets the requirements of high reflectivity, low resistivity, and the like for most current products.

SUMMARY

Embodiments of the present disclosure provide a display substrate and a method of manufacturing the display substrate.

According to an aspect of the present disclosure, a display substrate is provided, including a base substrate and a plurality of sub-pixels disposed on the base substrate, wherein the sub-pixel includes:

- a driving transistor located on the base substrate, wherein the driving transistor has a gate, a source, and a drain; and
- a light-emitting element located on a side of the driving transistor away from the base substrate, wherein the light-emitting element has a first electrode, a second electrode, and a light-emitting layer located between the first electrode and the second electrode, and the first electrode is electrically connected to the source or the drain of the driving transistor;

wherein the first electrode includes:

- a first conductive layer electrically connected to the source or the drain of the driving transistor;
- a second conductive layer located on a side of the first conductive layer away from the base substrate; and
- a transparent material layer located on a side of the second conductive layer away from the base substrate;

wherein the transparent material layer includes a first transparent material sub-layer and a second transparent material sub-layer, the first transparent material sub-layer is located between the second transparent material sub-layer and the second conductive layer, the second transparent material sub-layer covers the first transparent material sub-layer, and an edge of the first transparent material sub-layer is aligned with an edge of the second conductive layer.

For example, one of the first conductive layer and the second conductive layer is a composite material layer, the composite material layer includes a first conductive sub-layer and a second conductive sub-layer, the second conductive sub-layer is located on a side of the first conductive sub-layer away from the base substrate, and a material of the first conductive sub-layer is different from a material of the second conductive sub-layer.

For example, the first conductive layer is the composite material layer, wherein the material of the first conductive sub-layer of the composite material layer and the material of the second conductive sub-layer of the composite material layer are Ti and TiN respectively; and a material of the second conductive layer is TiN.

For example, a gap between adjacent first electrodes is filled with a lateral height coverage layer, and a material of the lateral height coverage layer is $SiO_x$ or $Al_2O_3$.

For example, a surface of the lateral height coverage layer on a side of the lateral height coverage layer away from the base substrate is higher than a surface of the second conductive layer on a side of the second conductive layer away from the base substrate.

For example, a thickness of the second conductive layer is less than a thickness of the second conductive sub-layer of the first conductive layer.

For example, the sub-pixel further includes a pixel defining layer located on a side of the first electrode away from the base substrate, a center of the pixel defining layer has an opening, an edge of the pixel defining layer has an undercut structure, a center of the transparent material layer is exposed from the opening, and an edge of the transparent material layer is covered by the pixel defining layer, wherein the pixel defining layer includes a first pixel defining sub-layer and a second pixel defining sub-layer, the first pixel defining sub-layer covers the edge of the transparent material layer, the second pixel defining sub-layer covers the first pixel defining sub-layer and forms the undercut structure with a sidewall of the first pixel defining sub-layer away from the transparent material layer, and a thickness of the first pixel defining sub-layer is greater than a thickness of the second pixel defining sub-layer.

For example, the display substrate further includes: a protective layer located between first pixel defining sub-layers of adjacent sub-pixels, wherein a thickness of the protective layer is less than the thickness of the second pixel defining sub-layer.

For example, a thickness of a part of the pixel defining layer covering the transparent material layer is greater than a thickness of a part of the transparent material layer exposed from the opening of the pixel defining layer.

For example, a thickness of a part of the pixel defining layer covering the transparent material layer is less than a thickness of a part of the pixel defining layer not covering the transparent material layer.

For example, a part of the pixel defining layer not covering the transparent material layer has a surface on a side of the pixel defining layer away from the base substrate being higher than a surface of the transparent material layer on a side of the transparent material layer away from the base substrate.

For example, an inclination angle of the undercut structure of the pixel defining layer is less than a slope angle of an opening sidewall of the pixel defining layer.

For example, an edge of the transparent material layer is tilted towards the light-emitting layer and covers an edge of the lateral height coverage layer.

For example, the transparent material layer includes a first transparent material sub-layer and a second transparent material sub-layer, the first transparent material sub-layer is located between the second transparent material sub-layer and the second conductive layer;

an edge of the first transparent material sub-layer is aligned with an edge of the second conductive layer.

For example, a surface roughness of the second transparent material sub-layer is less than a surface roughness of the first transparent material sub-layer.

For example, a thickness of the second transparent material sub-layer is greater than a thickness of the first transparent material sub-layer.

For example, a slope angle of a sidewall of the lateral height coverage layer towards the first electrode in a direction parallel to the base substrate is less than a slope angle of an opening sidewall of the pixel defining layer.

For example, a width of the undercut structure of the pixel defining layer in a direction parallel to the base substrate is greater than a difference between a thickness of a part of the pixel defining layer covering the transparent material layer and a thickness of a part of the pixel defining layer not covering the transparent material layer.

For example, the thickness of the second pixel defining sub-layer is less than a thickness of a part of the transparent material layer covering the lateral height coverage layer.

For example, the thickness of the first pixel defining sub-layer is greater than a thickness of a part of the transparent material layer covering the lateral height coverage layer.

For example, at the opening of the pixel defining layer, a part of the second pixel defining sub-layer covering the first pixel defining sub-layer extends to the transparent material layer.

For example, the undercut structure of the pixel defining layer has a projection on the lateral height coverage layer, and a thickness of an edge part of the lateral height coverage layer within the projection is greater than a thickness of a center part of the lateral height coverage layer outside the projection.

For example, a material of the first conductive layer is Ti or TiN, and the second conductive layer is the composite material layer, wherein the material of the first conductive sub-layer of the composite material layer and the material of the second conductive sub-layer of the composite material layer are Ti and TiN respectively.

For example, a material of the first conductive layer is Ti or TiN, and the second conductive layer is the composite material layer, wherein the material of the first conductive sub-layer of the composite material layer is TiN, and the material of the second conductive sub-layer of the composite material layer is $Al_2O_3$.

For example, the composite material layer further includes a third conductive sub-layer located between the first conductive sub-layer and the second conductive sub-layer, wherein a material of the third conductive sub-layer is ITO.

For example, the transparent material layer covers a stack of the first conductive layer, the metal layer, and the second conductive layer.

For example, the display substrate further includes a metal layer located between the first conductive layer and the second conductive layer, wherein a material of the metal layer is Al, and a material of the transparent material layer is ITO.

According to another aspect of the present disclosure, a method of manufacturing the above-mentioned display substrate is provided, including:

forming the driving transistor of each sub-pixel on the base substrate, so as to obtain a substrate structure; and forming, on the substrate structure, the first electrode, the light-emitting layer, and the second electrode of the light-emitting element of each sub-pixel in sequence;

wherein forming the first electrode of the light-emitting element includes:

forming, by a first deposition and etching, the first conductive layer, the metal layer, the second conductive layer, and the first transparent material sub-layer of the transparent material layer of the light-emitting element on the substrate structure;

forming, by a second deposition and etching, the second transparent material sub-layer of the transparent material layer on the first transparent material sub-layer.

DETAILED DESCRIPTION OF EMBODIMENTS

Figure 1:
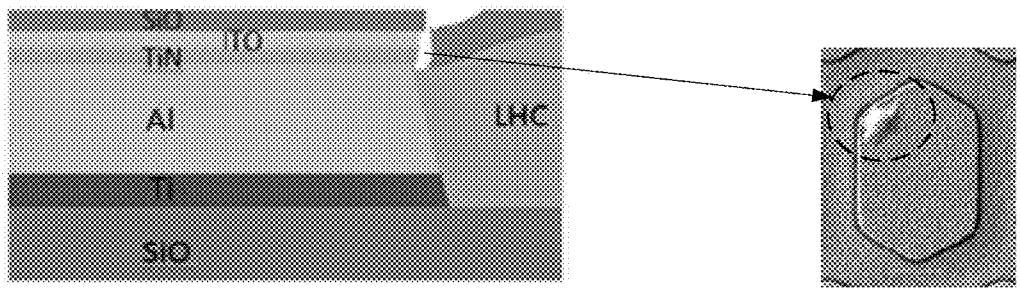
FIG. 1 shows a structure of a first electrode of a sub-pixel.

In order to make the objectives, technical solutions, and advantages of the embodiments of the present disclosure more clear, the technical solutions of the embodiments of the present disclosure will be described clearly and completely below with reference to the drawings in the embodiments of the present disclosure. The described embodiments make up a part of the embodiments of the present disclosure, but not all of the embodiments. All other embodiments obtained by those of ordinary skilled in the art based on the described embodiments of the present disclosure without carrying out any inventive effort shall fall within the protection scope of the present disclosure. It should be noted that throughout the drawings, the same or similar reference numbers denote the same or similar elements. In the following description, some specific embodiments are only for descriptive purposes and should not be understood as limiting the present disclosure, but rather as examples of the embodiments of the present disclosure. Conventional structures or configurations may be omitted when they may cause confusion in the understanding of the present disclosure. It should be noted that the shape and size of each component in the figure do not reflect the true size and proportion, but only represent the content of the embodiments of the present disclosure.

Unless otherwise defined, the technical or scientific terms used in the embodiments of the present disclosure shall have the usual meaning understood by those skilled in the art. The terms "first", "second", and similar terms used in the embodiments of the present disclosure do not indicate any order, quantity, or importance, but are only used to distinguish different components.

In addition, in the description of the embodiments of the present disclosure, the terms "connected" or "connected to" may refer to two components directly connected, or may refer to two components connected through one or more other components. In addition, these two components may be connected or coupled through wired or wireless means.

An anode of a sub-pixel is usually a multi-layer structure, such as but not limited to Ti/Al/Ti/ITO, Ti/Al/TiN/ITO, and Cr/Al/Cr/Mo. Although continuous optimization of a coating method may ensure the flatness of a positive surface of the anode, there are still the following problems. ① Al is prone to producing a sharp protrusion (Hillock) in an Al crystal growth during a thermal processing, resulting in a poor anode roughness, a decreased reflectivity, a poor anode injection efficiency, a low OLED light-emitting efficiency, and an increased power consumption. ② The Al on a side of the pixel has no coating protection, which is prone to an electrochemical reaction during the manufacturing process to cause Al corrosion, resulting in a high incidence of point line defects. ③ A position of a wu hole is prone to Al migration, resulting in a high incidence of black spot defects. ④ During the ITO film formation process, there are pin holes between grains, and a development solution is prone to entering the Al film layer on the anode surface along these pin holes in the subsequent manufacturing process, resulting in Al corrosion.

FIG. 1 shows an anode structure of a sub-pixel. As shown in FIG. 1, the anode is a multi-layer structure, including a Ti layer, an Al layer, a Ti layer, and an ITO layer stacked on a SiO layer in sequence. Due to inconsistent etching selection ratios for ITO and Ti/AL etching and a relatively thick ITO, there is an undercut between an ITO material on an anode sidewall and an underlying metal layer after etching is completed. Due to the undercut, it is easy for the development solution to be left in a gap between the anode and an LHC on an anode side during the subsequent manufacturing process and thus corrode the AL layer.

Embodiments of the present disclosure provide a display substrate, including a base substrate and a plurality of sub-pixels disposed on the base substrate. The sub-pixel includes a driving transistor and a light-emitting element. The driving transistor is located on the base substrate, and the driving transistor has a gate, a source, and a drain. The light-emitting element is located on a side of the driving transistor away from the base substrate, and the light-emitting element has a first electrode, a second electrode, and a light-emitting layer located between the first electrode and the second electrode. The first electrode is electrically connected to the source or the drain of the driving transistor. The first electrode of the sub-pixel includes a first conductive layer, a metal layer, a second conductive layer, and a transparent material layer. The first conductive layer is electrically connected to the source or the drain of the driving transistor; the metal layer is located on a side of the first conductive layer away from the base substrate; the second conductive layer is located on a side of the metal layer away from the base substrate; and the transparent material layer is located on a side of the second conductive layer away from the base substrate. The transparent material layer includes a first transparent material sub-layer and a second transparent material sub-layer. The first transparent material sub-layer is located between the second transparent material sub-layer and the second conductive layer. The second transparent material sub-layer covers the first transparent material sub-layer. An edge of the first transparent material sub-layer is aligned with an edge of the second conductive layer. By aligning the edge of the first transparent material sub-layer with the edge of the second conductive layer, the influence of stress on the upper second transparent material sub-layer may be mitigated or even avoided.

Figure 2:
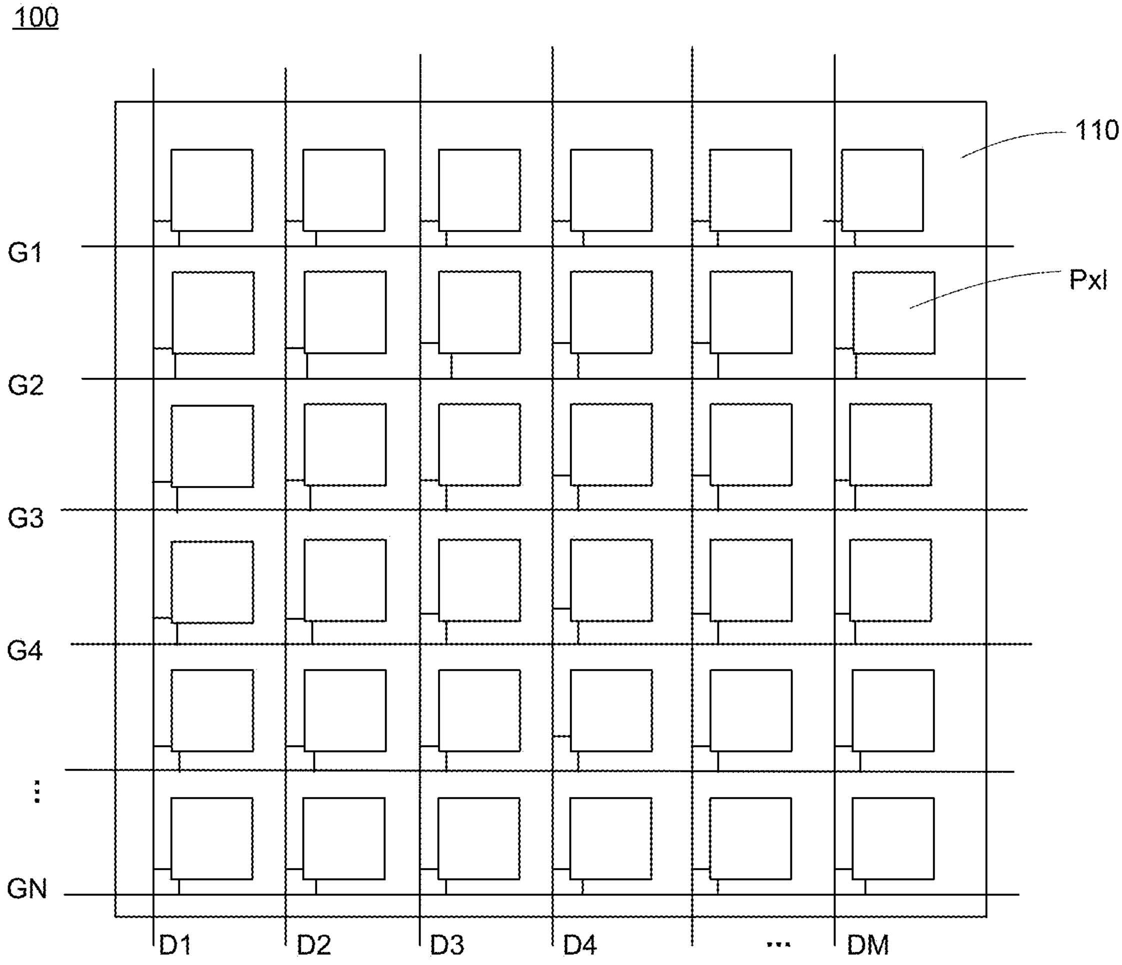
FIG. 2 shows a planar schematic diagram of a display substrate according to an embodiment of the present disclosure.

FIG. 2 shows a planar schematic diagram of a display substrate according to an embodiment of the present disclosure.

As shown in FIG. 2, the display substrate 100 includes a base substrate 110 and a plurality of sub-pixels Pxl disposed on the base substrate 110, and the plurality of sub-pixels Pxl are arranged in a form of an array. In FIG. 2, the plurality of sub-pixels Pxl are arranged into N rows and M columns. The display substrate 100 may further be provided with a plurality of gate lines G1, G2, . . . . GN electrically connected to the plurality of sub-pixels Pxl. The display substrate 100 may further be provided with a plurality of data lines D1, D2, . . . . DM electrically connected to the plurality of sub-pixels Pxl. In FIG. 2, N rows of sub-pixels Pxl are connected one-to-one with N gate lines G1, G2, . . . . GN, while M columns of sub-pixels Pxl are connected one-to-one with M data lines D1, D2, . . . . DM. That is to say, each row of sub-pixels is connected to one gate line, and each column of sub-pixels is connected to one data line. However, the embodiments of the present disclosure are not limited to this. The number and connection method of gate lines and data lines may be selected according to needs, for example, each row of sub-pixels may be connected to two gate lines, and the number of gate lines is twice the number of rows of sub-pixels; alternatively, every two columns of sub-pixels may be connected to one data line, and the number of data lines is half of the number of columns of sub-pixels, and the like.

During operation, a gate driving circuit applies a gate driving signal to the gate lines G1 to GN to turn on each row of sub-pixels Pxl, and a source driving circuit applies a source driving signal to the data lines D1 to DM to display the turned-on sub-pixels Pxl according to the applied source driving signal. In some embodiments, the display substrate 100 may further be provided with a plurality of light-emitting control lines connected to the plurality of sub-pixels, and a light-emitting driving circuit provides a light-emitting control signal to the plurality of sub-pixels through the plurality of light-emitting control lines.

Figure 3:
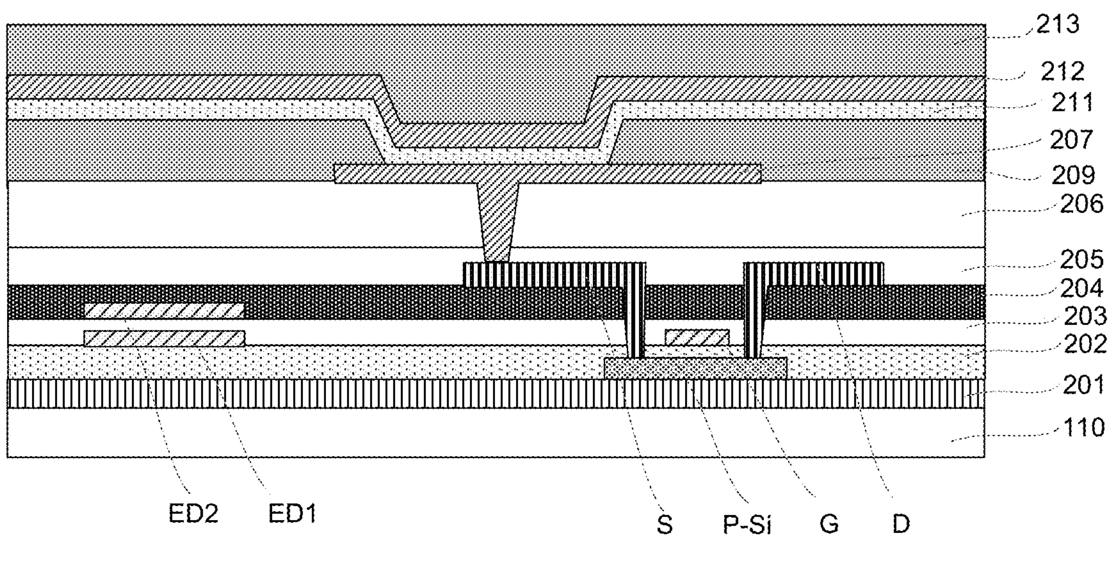
FIG. 3 shows a cross-sectional view of a sub-pixel in a display substrate according to an embodiment of the present disclosure.

FIG. 3 shows a cross-sectional view of a sub-pixel in a display substrate according to an embodiment of the present disclosure.

As shown in FIG. 3, at least one of the plurality of sub-pixels in the display substrate includes a driving transistor having a gate G, a source S, and a drain D. The driving transistor may further include an active layer P-Si located on the base substrate 110, and the gate G is located on a side of the active layer P-Si away from the base substrate 110. The driving transistor may further include a first gate insulation layer 202 located between the active layer P-Si and the gate G, a second gate insulation layer 203 located on a side of the gate G away from the base substrate 110, and an interlayer dielectric layer 204 located on a side of the second gate insulation layer 203 away from the base substrate. The source S and the drain D are located on a side of the interlayer dielectric layer 204 away from the base substrate. The sub-pixel may further include a storage capacitor, and the storage capacitor includes a first capacitor electrode ED1 and a second capacitor electrode ED2. The first capacitor electrode ED1 is located on the same layer as the gate G, and the second capacitor electrode ED2 is located between the second gate insulation layer 203 and the interlayer dielectric layer 204.

As shown in FIG. 3, the sub-pixel may further include a light-emitting element located on a side of the driving transistor away from the base substrate 110. The light-emitting element includes a first electrode 207, a second electrode 212, and a light-emitting layer 211 located between the first electrode 207 and the second electrode 212. The first electrode 207 is electrically connected to the source S or the drain D of the driving transistor. In some embodiments, the first electrode 207 may be an anode, and the second electrode 212 may be a cathode.

The sub-pixel may further include a flat layer 206 and a pixel defining layer 209. The flat layer 206 is located on a side of the interlayer dielectric layer 204 away from the base substrate 110. The first electrode 207 is located on a side of the flat layer 206 away from the base substrate 110 and connected to the source S or the drain D through the flat layer 206. The pixel defining layer 209 is located on a side of the flat layer 206 away from the base substrate 110 and partially covers the first electrode 207.

In some embodiments, the sub-pixel may further include a buffer layer 201. The buffer layer 201 is located between the base substrate 110 and the first gate insulation layer 202. The active layer P-Si of the driving transistor is located between the buffer layer 201 and the first gate insulation layer 202.

In some embodiments, the sub-pixel may further include a passivation layer 205. The passivation layer 205 is located between the flat layer 206 and the interlayer dielectric layer 204, and covers the source S and the drain D of the driving transistor. The first electrode 207 is connected to the source S of the driving transistor through the interlayer dielectric layer 206 and the passivation layer 205.

In some embodiments, the sub-pixel may further include a light-emitting layer 211 and a second electrode 212. The light-emitting layer 211 is located on a side of the first electrode 210 away from the base substrate 110 and partially covers the first electrode 207. The second electrode 212 is located on a side of the light-emitting layer 211 away from the base substrate 110.

In some embodiments, the sub-pixel may further include an encapsulation layer 213. The encapsulation layer 213 is located on a side of the second electrode 212 away from the base substrate 110. In some embodiments, the encapsulation layer 213 may include a first inorganic encapsulation layer, an organic encapsulation layer, and a second inorganic encapsulation layer that are stacked in sequence.

Although the above embodiments illustrate the layout and layer structure of the sub-pixel in the display substrate by using a specific layer structure as an example, the embodiments of the present disclosure are not limited to this. The sub-pixels in the display substrate may be distributed in the display substrate in any suitable way as needed, and each sub-pixel may have other layer structures as needed, as long as the driving transistor of the sub-pixel may drive the light-emitting element to emit light.

A structure of a first electrode of a sub-pixel of an embodiment of the present disclosure will be described below with reference to FIGS. 4 to 6.

Figure 4:
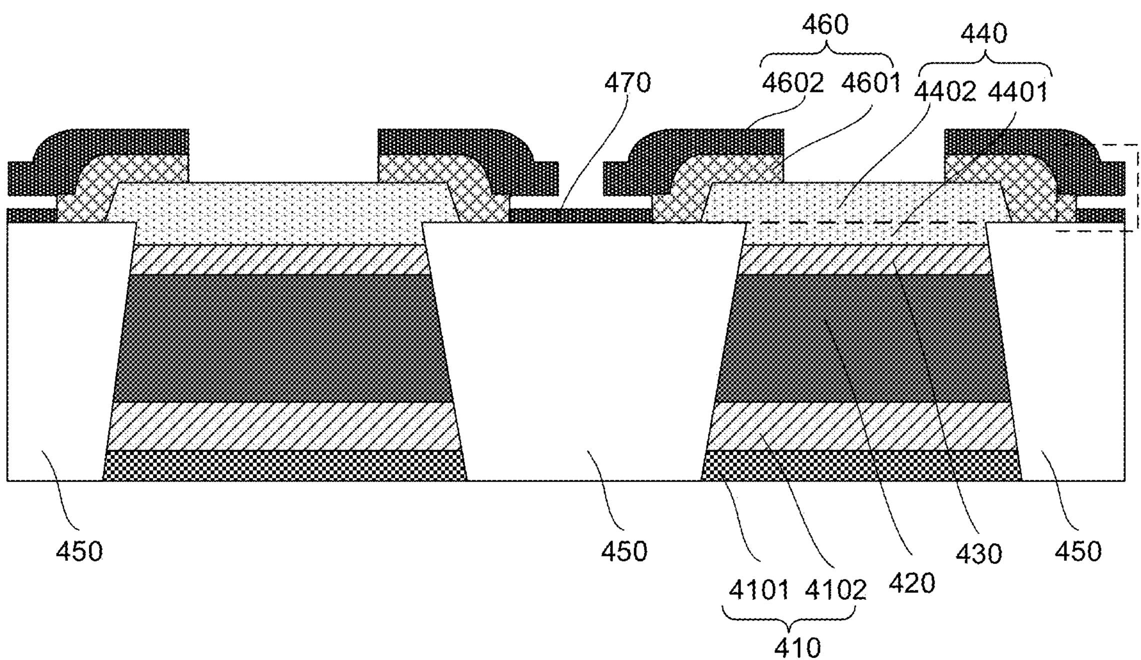
FIG. 4 shows a cross-sectional view of a first electrode of a sub-pixel according to an embodiment of the present disclosure.

FIG. 4 shows a cross-sectional view of a first electrode of a sub-pixel according to an embodiment of the present disclosure. FIG. 5 shows a planar micrograph of a first electrode of the sub-pixel shown in FIG. 4. FIG. 6 shows a cross-sectional micrograph of the first electrode of the sub-pixel shown in FIG. 4. The first electrode structure shown in FIGS. 4 to 6 is applicable to the sub-pixel of any of the above embodiments. The two first electrodes in FIG. 4 have the same structure. For ease of description, layers of a first electrode on a right side are labeled.

As shown in FIG. 4, the first electrode includes a first conductive layer 410, a metal layer 420, a second conductive layer 430, and a transparent material layer 440. The first conductive layer 410 is electrically connected to the source S or the drain D of the driving transistor, for example, electrically connected to the source S in the manner shown in FIG. 3. The metal layer 420 is located on a side of the first conductive layer 410 away from the base substrate 110. The second conductive layer 430 is located on a side of the metal layer 420 away from the base substrate 110. The transparent material layer 440 is located on a side of the second conductive layer 430 away from the base substrate 110.

According to the embodiments of the present disclosure, one of the first conductive layer 410 and the second conductive layer 430 of the first electrode may be a composite material layer, and the composite material layer includes a first conductive sub-layer and a second conductive sub-layer. The second conductive sub-layer is located on a side of the first conductive sub-layer away from the base substrate, and a material of the first conductive sub-layer is different from a material of the second conductive sub-layer. For example, the material of the first conductive sub-layer of the composite material layer may be Ti, and the material of the second conductive sub-layer may be TiN or $Al_2O_3$. The other of the first conductive layer and the second conductive layer may be a single material layer, for example, a material of the single material layer may be Ti or TiN. By disposing the conductive layer on at least one side of the metal layer as the composite material layer including at least two sub-layers, the metal layer may be prevented from being corroded.

In an example of FIG. 4, the first conductive layer 410 is a composite material layer, and the second conductive layer 430 is a single material layer. As shown in FIG. 4, the first conductive layer 410 includes a first conductive sub-layer 4101 and a second conductive sub-layer 4102. The second conductive sub-layer 4102 is located on a side of the first conductive sub-layer 4101 away from the base substrate 110. A material of the first conductive sub-layer 4101 of the first conductive layer 410 may be Ti, and a material of the second conductive sub-layer 4102 of the first conductive layer 410 may be TiN. The material of the second conductive layer 430 may be TiN. In some embodiments, a thickness of the second conductive layer 430 is less than a thickness of the second conductive sub-layer 4102 of the first conductive layer 410. For example, the thickness of the second conductive layer 430 may be about 100 A, and the thickness of the second conductive sub-layer 4102 of the first conductive layer 410 may be about 150 A. The thickness of the first conductive sub-layer 4101 of the first conductive layer 410 may be about 100 A. A material of the metal layer 420 may be Al, with a thickness of about 700 A. A material of the transparent material layer 440 may be ITO, with a thickness of about 200 A. The transparent material layer 440 may be formed through two rounds of deposition and etching processes to reduce an impact of stress on the transparent material layer 440, which will be explained in detail below.

In some embodiments, a gap between adjacent first electrodes may be filled with a lateral height coverage layer (LHC) 450. A material of the lateral height coverage layer 450 includes but is not limited to $SiO_x$ or $Al_2O_3$. A sidewall of the first electrode may be protected by filling the gap between the first electrodes with the height coverage layer 450.

As shown in FIG. 4, the sub-pixel further includes a pixel defining layer 460, and the pixel defining layer 460 is provided on a side of the first electrode away from the base substrate. A center of the pixel defining layer 460 has an opening and an edge of the pixel defining layer 460 has an undercut structure (as indicated by the box in FIG. 4). A center of the transparent material layer 440 is exposed from the opening of the pixel defining layer 460, and an edge of the transparent material layer 440 is covered by the pixel defining layer 460. The pixel defining layer 460 may include a first pixel defining sub-layer 4601 and a second pixel defining sub-layer 4602. The first pixel defining sub-layer 4601 covers the edge of the transparent material layer 440. The second pixel defining sub-layer 4602 covers the first pixel defining sub-layer 4601 and forms the undercut structure with a sidewall of the first pixel defining sub-layer 4601 away from the transparent material layer 440. In some embodiments, a thickness of the first pixel defining sub-layer 4601 is greater than a thickness of the second pixel defining sub-layer 4602. For example, a material of the first pixel defining sub-layer 4601 may be $SiN_x$, with a thickness of about 600 A. A material of the second pixel defining sub-layer 4602 may be $SiO_x$, with a thickness of about 200 A. The second pixel defining sub-layer 4602 may be deposited before the pad open, which may protect the metal layer of the first electrode from corrosion by the development solution during the development process of the pad open.

In some embodiments, the display substrate may further include a protective layer 470. The protective layer 470 is located between first pixel defining sub-layers 4601 of adjacent sub-pixels (such as the left and right sub-pixels in FIG. 4). A thickness of the protective layer 470 may be less than the thickness of the second pixel defining sub-layer 4602. For example, a material of the protective layer 470 may be SiO, with a thickness of about 100 A.

In some embodiments, the transparent material layer 440 may include a first transparent material sub-layer 4401 and a second transparent material sub-layer 4402 (as materials of the two sub-layers are the same, a boundary between the two sub-layers is represented by a dashed line in FIG. 4). The first material sub-layer 4401 is located between the second transparent material sub-layer 4402 and the second conductive layer 430. The first transparent material sub-layer 4401 and the second conductive layer 430 may be formed in the same deposition and etching process, so that an edge of the first transparent material sub-layer 4401 is aligned with an edge of the second conductive layer 430. The second transparent material sub-layer 4402 may be formed in another subsequent deposition and etching process. In this way, the influence of stress on the second transparent material sub-layer 4402 in the upper layer may be mitigated or even avoided.

Figure 5:
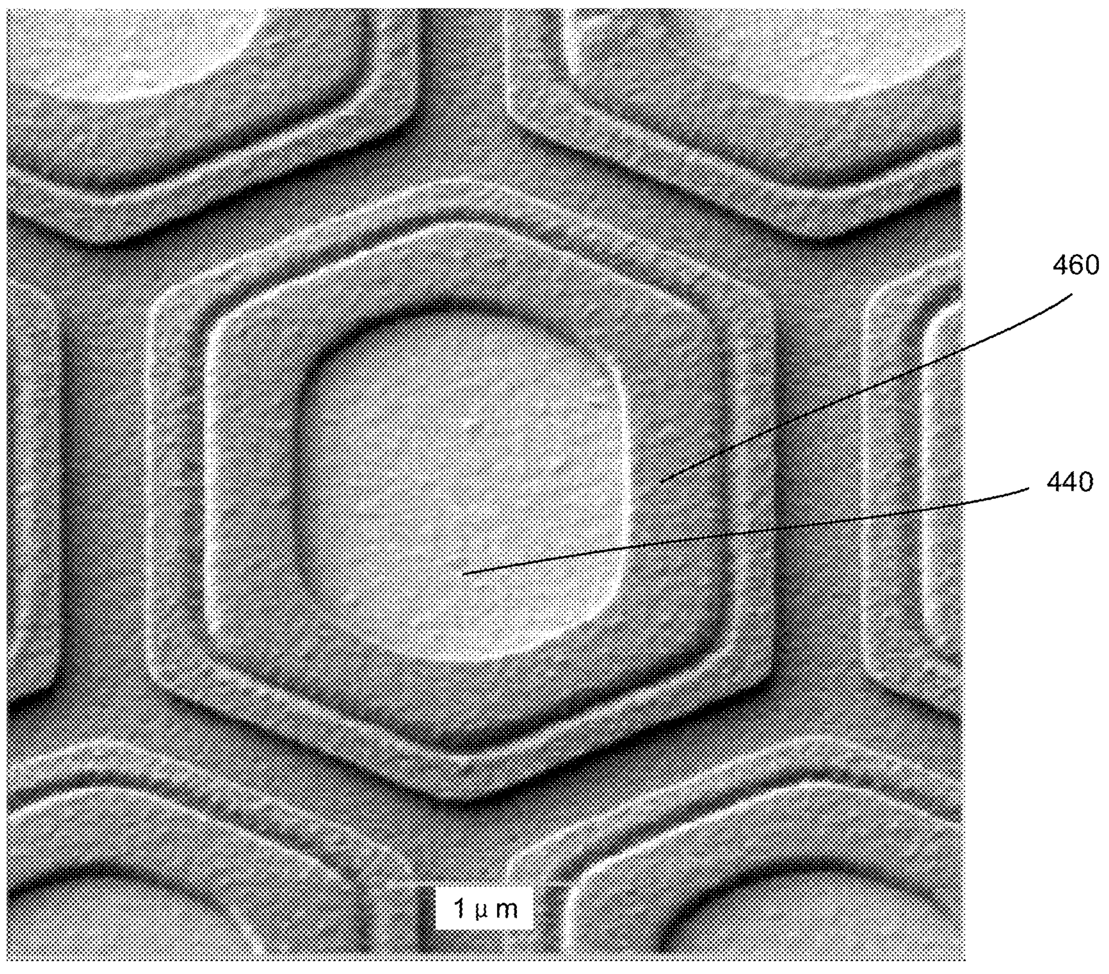
FIG. 5 shows a planar micrograph of a first electrode of the sub-pixel shown in FIG. 4.

As shown in FIG. 5, a center of the pixel defining layer 460 of the sub-pixel has an opening. A center of the transparent material layer 440 is exposed from the opening of the pixel defining layer 460, and an edge of the transparent material layer 440 is covered by the pixel defining layer 460.

Figure 6:
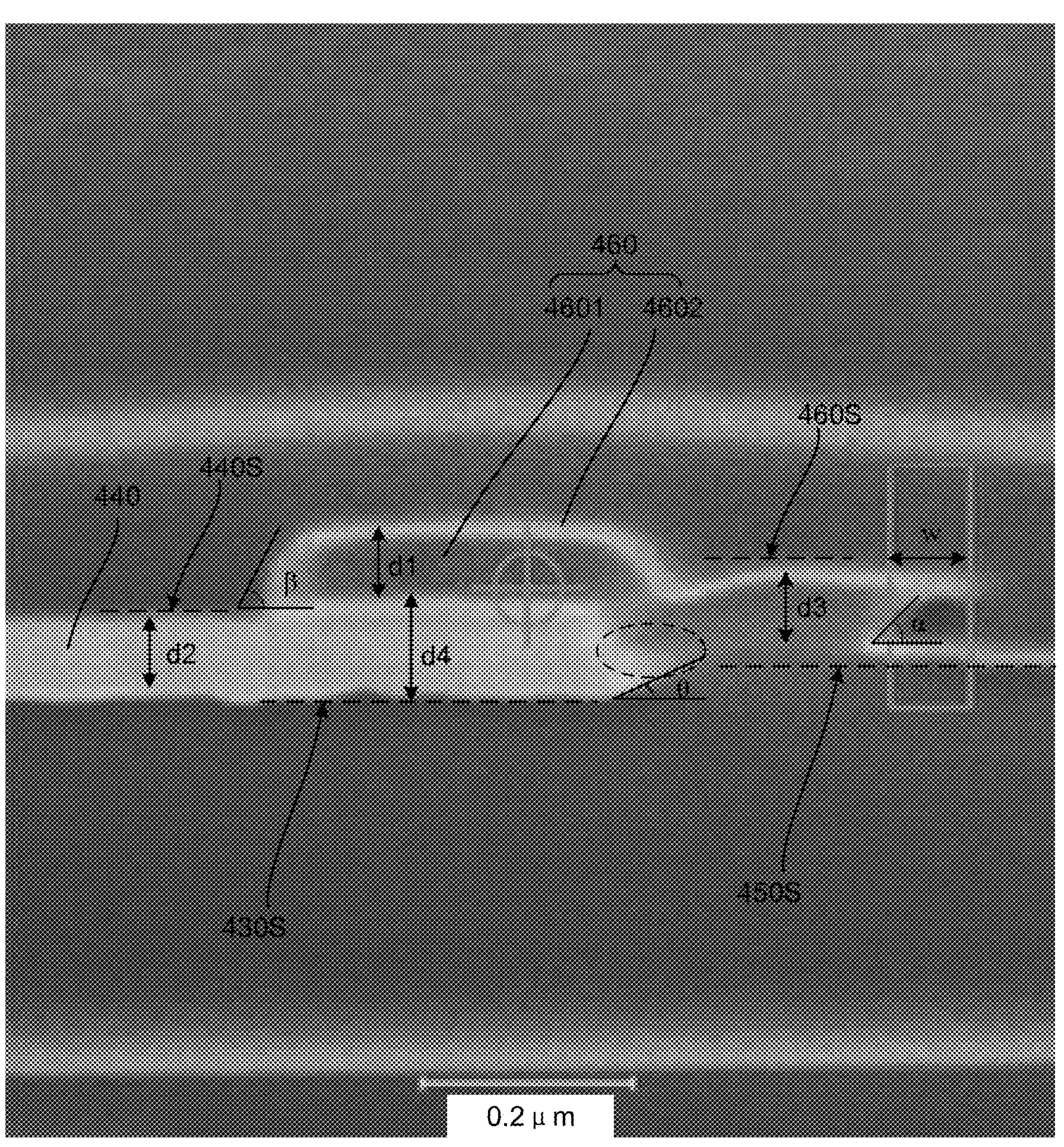
FIG. 6 shows a cross-sectional micrograph of the first electrode of the sub-pixel shown in FIG. 4.

As shown in FIG. 6, a part of the pixel defining layer 460 covers the edge of the transparent material layer 440, while the other part of the pixel defining layer 460 does not cover the transparent material layer 440 (but covers a layer structure close to the transparent material layer), thereby achieving a coverage of the edge of the transparent material layer 440. In some embodiments, an average thickness of the pixel defining layer 460 is in a range from 0.08 to 0.15 um. A thickness d1 of the part of the pixel defining layer 460 covering the transparent material layer 440 may be greater than a thickness d2 of the part of the transparent material layer 440 exposed from the opening of the pixel defining layer 460. The thickness d1 of the part of the pixel defining layer 460 covering the transparent material layer 440 may be less than a thickness d3 of a part of the pixel defining layer 460 not covering the transparent material layer 440. In some embodiments, a size (also referred as a width of covered edge of the pixel defining layer) of the part of the pixel defining layer 460 covering the transparent material layer 440 in a direction (horizontal direction) parallel to the substrate surface is in a range from 0.25 to 0.35 um. In some embodiments, the part of the pixel defining layer 460 not covering the transparent material layer 440 has a surface 460S on the side of the pixel defining layer 460 away from the base substrate being higher than a surface 440S of the transparent material layer 440 on the side of the transparent material layer 440 away from the base substrate. The thickness d2 of a part of the transparent material layer 440 not covered by the pixel defining layer 460 is less than the thickness d4 of a part of the transparent material layer 440 covered by the pixel defining layer 460, As shown in FIG. 6, the pixel defining layer 460 includes the first pixel defining sub-layer 4601 and the second pixel defining sub-layer 4602. At the opening of the pixel defining layer 460, a part of the second pixel defining sub-layer 4602 covering the first pixel defining sub-layer 4601 extends to the transparent material layer 440, thereby achieving a coverage of a side edge of the first pixel defining sub-layer 4601. In some embodiments, as shown in FIG. 6, the edge (as shown in the elliptical dashed box in FIG. 6) of the transparent material layer 440 may be tilted towards the upper light-emitting layer and cover the edge of the lateral height coverage layer 450. The first pixel defining sub-layer 4601 may be provided to be relatively thick, for example, the thickness of the first pixel defining sub-layer 4601 may be greater than the thickness of the part (as shown in the elliptical dashed box in FIG. 6) of the transparent material layer 440 covering the lateral height coverage layer 450. The second pixel defining sub-layer 4602 may be provided to be relatively thin, for example, the thickness of the second pixel defining sub-layer 4602 may be less than the thickness of the part (as shown in the elliptical dashed box in FIG. 6) of the transparent material layer 440 covering the lateral height coverage layer 450.

As shown in FIG. 6, the pixel defining layer 460 has an undercut structure (as shown in the box in FIG. 6) on an edge on a side of the pixel defining layer 460 away from the opening. An inclination angle $\alpha$ of the undercut structure of the pixel defining layer 460 may be less than a slope angle $\beta$ of an opening sidewall of the pixel defining layer 460. In some embodiments, the inclination angle $\alpha$ of the undercut structure is greater than 80°. In some embodiments, as shown in FIG. 6, a width w of the undercut structure of the pixel defining layer 460 in the direction parallel to the base substrate may be greater than a difference between the thickness d1 of the part of the pixel defining layer 460 covering the transparent material layer 440 and the thickness d3 of the part of the pixel defining layer 460 not covering the transparent material layer 440, i.e. $w>d3-d1$. In some embodiments, the width w (also referred as an undercut depth) of the undercut structure in the direction parallel to the base substrate is in a range of 0.08 to 0.12 um. By setting the width w of the undercut structure in this way, a cutoff effect of the pixel defining layer 460 may be improved.

As shown in FIG. 6, a surface 450S of the lateral height coverage layer 450 on the side of the lateral height coverage layer 450 away from the base substrate may be higher than a surface 430S of the second conductive layer 430 on the side of the second conductive layer 430 away from the base substrate. The lateral height coverage layer 450 has a slope angle $\theta$ on a sidewall facing the first electrode side in the direction (the horizontal direction in FIG. 6) parallel to the base substrate. The slope angle $\theta$ may be less than the slope angle $\beta$ of the opening sidewall of the pixel defining layer 460. By setting 0<B, it may reduce or even avoid the occurrence of second electrode puncture. From FIG. 6, it may be seen that the undercut structure (as shown in the box in FIG. 6) of the pixel defining layer 460 has a projection on the lateral height coverage layer 450. A part of the edge of the lateral height coverage layer 450 is located within the projection (in a projection area of the box in FIG. 6), while a center part of the lateral height coverage layer 450 is located outside the projection (outside the box in FIG. 6, on a right side of the box). A surface of the edge part within the projection is higher than a surface of the center part outside the projection. In other words, a thickness of the edge part of the lateral height coverage layer 450 located within the projection is greater than a thickness of the center part of the lateral height coverage layer 450 located outside the projection.

As shown in FIG. 6, a surface roughness of the second transparent material sub-layer (an upper half part of the transparent material layer 440) of the transparent material layer 440 is less than a surface roughness of the first transparent material sub-layer (a lower half part of the transparent material layer 440). In some embodiments, the thickness of the second transparent material sub-layer is greater than the thickness of the first transparent material sub-layer. For example, a relatively thin first transparent material sub-layer may be formed by the first deposition and etching (such as dry etching) to align the edge of the first transparent material sub-layer with the lower second conductive layer, and then a relatively thick second transparent material sub-layer may be formed by the second deposition and etching.

In the above-mentioned embodiments, the so-called surface height may refer to a height of the surface with respect to the base substrate, and the so-called thickness of the layer may refer to a thickness of the layer in a direction perpendicular to the base substrate.

In the display substrate of the embodiments of the present disclosure, a TiN layer is provided on two sides of the metal layer of the first electrode, and the lateral height coverage layer is provided on two sides of the first electrode. The transparent material layer above the metal layer of the first electrode is implemented as a structure that covers the edge of the lateral height coverage layer, and the pixel defining layer covering the edge of the first electrode is implemented as the undercut structure. In this way, the protection of the metal layer of the first electrode is achieved from multiple perspectives, effectively reducing the risk of corrosion on the surface of the first electrode and the side edges of the metal layer while ensuring the high reflectivity. At the same time, it may suppress metal migration of the metal layer to improve the occurrence of point line defects.

The embodiments of the present disclosure further provide a method of manufacturing the display substrate, which is applicable to the display substrate of any of the above-mentioned embodiments. This method includes: forming the driving transistor of each sub-pixel on the base substrate, so as to obtain a substrate structure; and forming, on the substrate structure, the first electrode, the light-emitting layer, and the second electrode of the light-emitting element of each sub-pixel in sequence; wherein forming the first electrode of the light-emitting element includes: forming, by a first deposition and etching, the first conductive layer, the metal layer, the second conductive layer, and the first transparent material sub-layer of the transparent material layer of the light-emitting element on the substrate structure; forming, by a second deposition and etching, the second transparent material sub-layer of the transparent material layer on the first transparent material sub-layer.

A process of manufacturing a first electrode of a sub-pixel of an embodiment of the present disclosure will be described below with reference to FIGS. 7 to 16. The process of manufacturing the first electrode of the embodiments of the present disclosure involves two rounds (also referred as two times) of deposition and etching, in which the first deposition and etching process is shown in FIGS. 7 to 12, and the second deposition and etching process is shown in FIGS. 13 to 16.

Figure 7:
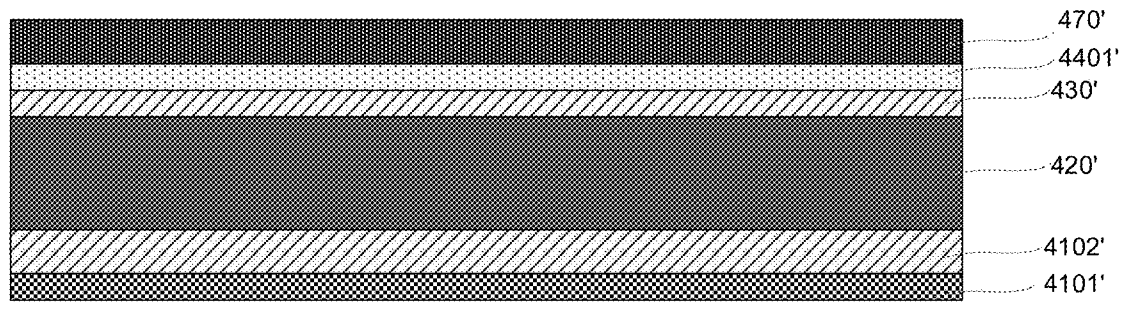
FIGS. 7 to 16 show a process of manufacturing a first electrode of a sub-pixel of an embodiment of the present disclosure.

First, as shown in FIG. 7, a first conductive material 4101' (such as Ti with a thickness of about 100 A), a second conductive material 4102' (such as TiN with a thickness of about 150 A), a metal material 420' (such as Al with a thickness of about 700 A), a third conductive material 430' (such as TiN with a thickness of about 15 A), and a transparent material 4401' (such as ITO with a thickness of about 50 A) are deposited in sequence (such as by sputtering) on the above substrate structure. The deposition of these material layers may be achieved. Then, a protective material 470' (such as $SiN_x$ with a thickness of about 300 A) is deposited on the transparent material 4401'. The deposition of the protective material 470' may be achieved by chemical vapor deposition (CVD). In this way, a stack structure is obtained. In the stack structure, the first conductive material 4101' and the second conductive material 4102' are respectively used to form the first conductive sub-layer and second conductive sub-layer of the first conductive layer of the first electrode. The metal material 420' is used to form the metal layer of the first electrode. The third conductive material 430' is used to form the second conductive layer of the first electrode. The transparent material 4401' is used to form the first transparent material sub-layer of the transparent material layer of the first electrode. The protective material 470' is used to form the protective layer of the first electrode.

Figure 8:
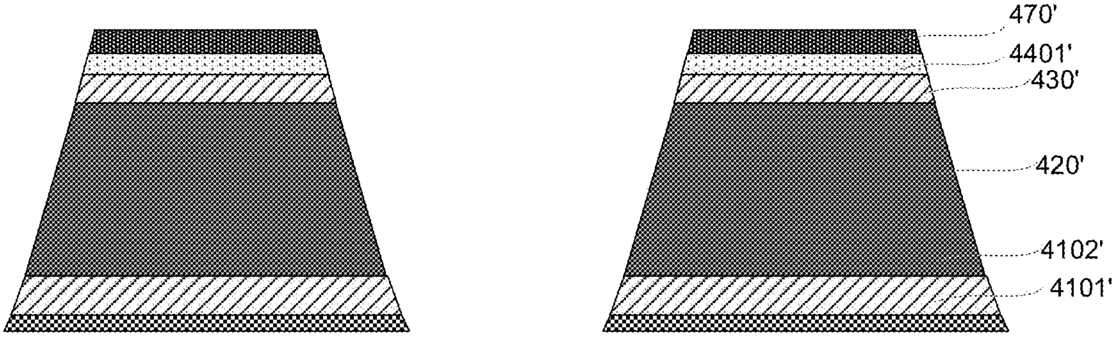
Figure 9:
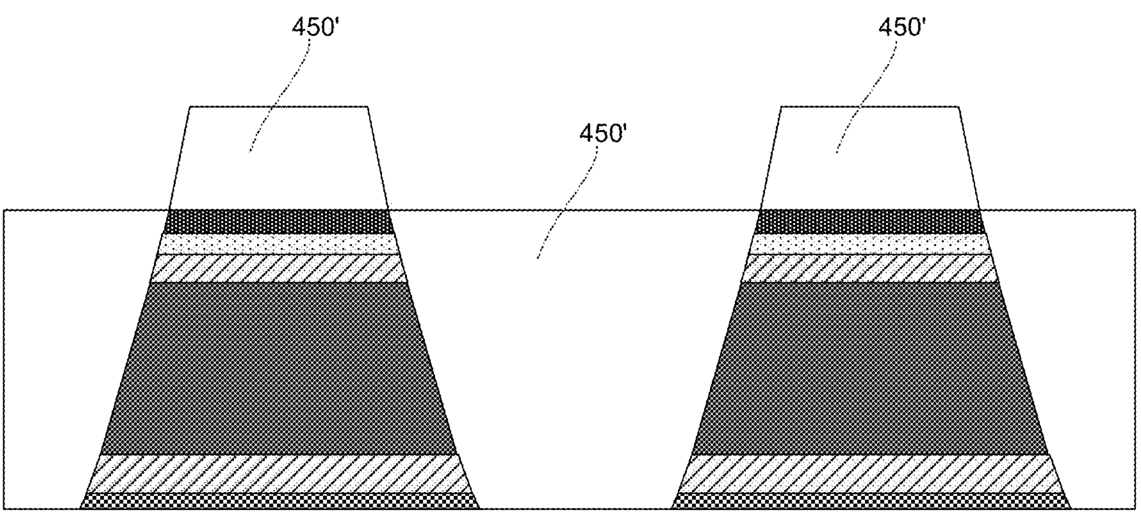

Then, as shown in FIG. 8, the stack structure in FIG. 7 is etched to complete the first pixelation of the first electrode structure, so as to obtain a plurality of independent first electrode material stack structures. A critical dimension (CD) of etching may be 1.1±0.05 um. The protective material 470' ($SiN_x$) may protect the transparent material 4401' (ITO) below during subsequent manufacturing processes. Then, as shown in FIG. 9, the structure shown in FIG. 8 is filled with an isolation material 450' (such as $SiO_x$ with a thickness of about 3000 A), so as to fill a gap between adjacent first electrode material stack structures, and also to protect the sidewall of the first electrode. At this point, the process of filling the isolation material 450' results in a certain thickness of the isolation material 450' covering a top of the first electrode material stack structure. Next, processing is needed to remove the isolation material 450' covering the top of the first electrode material stack structure, while retaining the isolation material 450' in the gap between the first electrode material stack structures.

Figure 10:
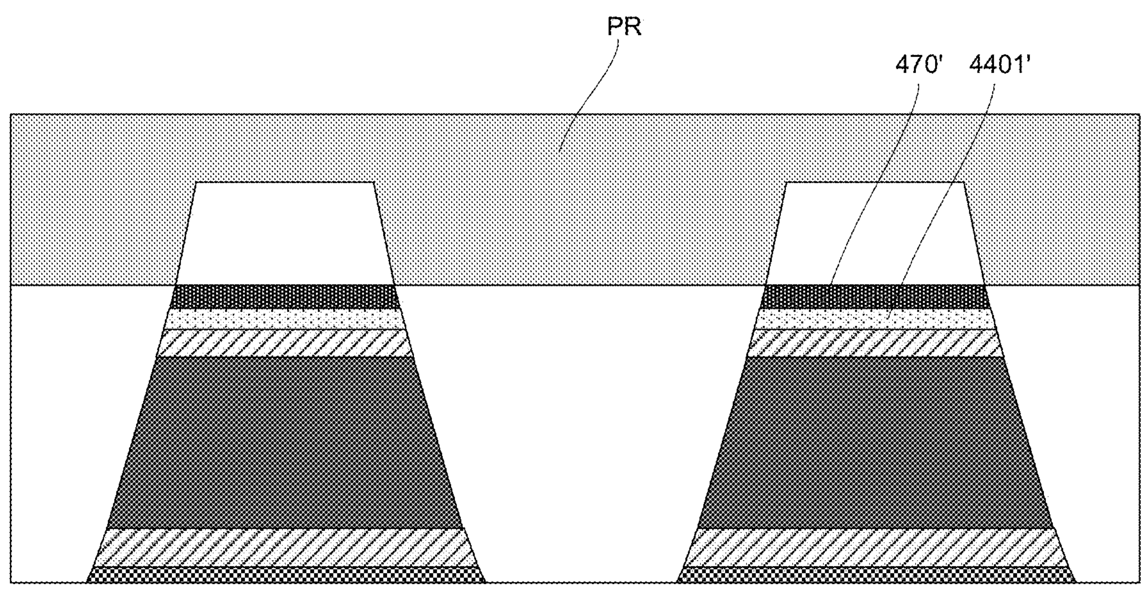
Figure 11:
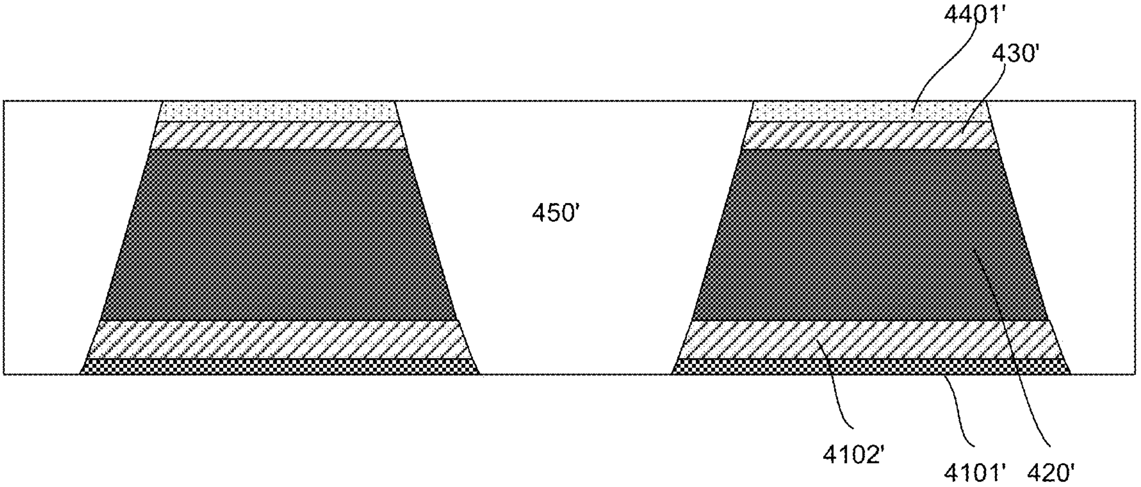

As shown in FIG. 10, a photoresist PR, such as a photoresist of about 4000 A, is coated on the structure of FIG. 9. A thickness of the photoresist PR is greater than a thickness of the isolation material 450', thereby flattening the surface of the structure. Then, as shown in FIG. 11, the structure of FIG. 10 is etched. In etching, an etching selection ratio of the isolation material 450' to the photoresist PR is set to close to 1:1, thereby removing the isolation material 450' above the first electrode along with the photoresist PR, while retaining the isolation material 450' between adjacent first electrodes. During the process of removing the isolation material 450', the protective material 470' protects the transparent material 4401' (ITO) below. Then, as shown in FIG. 12, etching is continued to further remove the isolation material 450', so that an upper surface of the isolation material 450' is lower than an upper surface of the transparent material 4401'.

At this point, the first deposition and etching have been completed. Next, proceed with the second deposition and etching.

Figure 12:
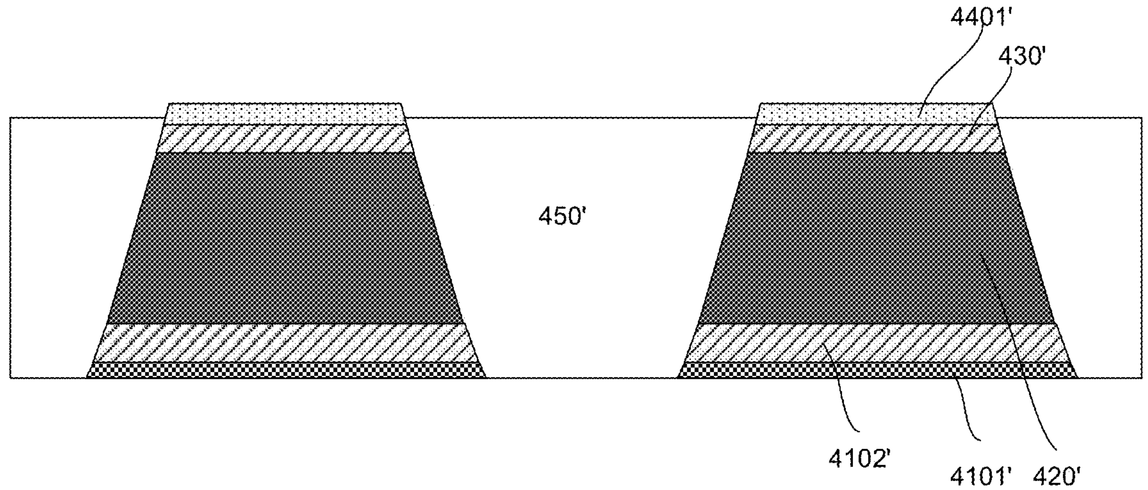
Figure 13:
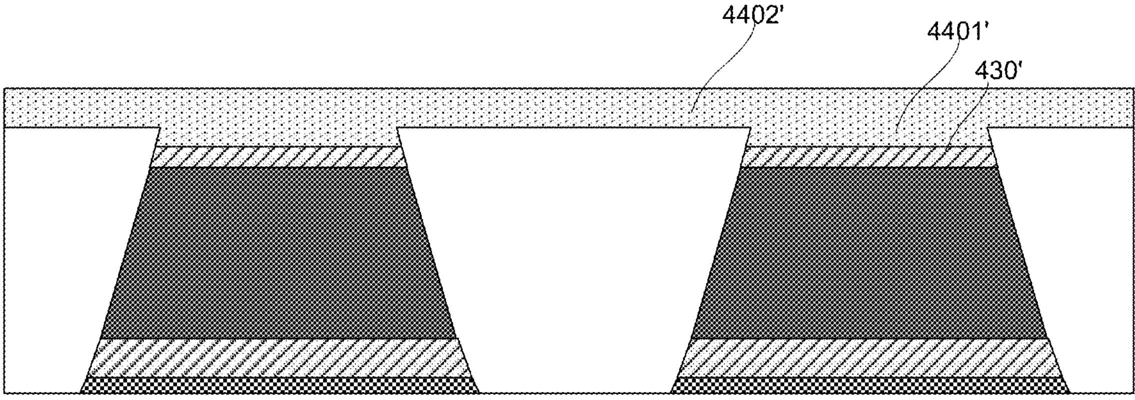
Figure 14:
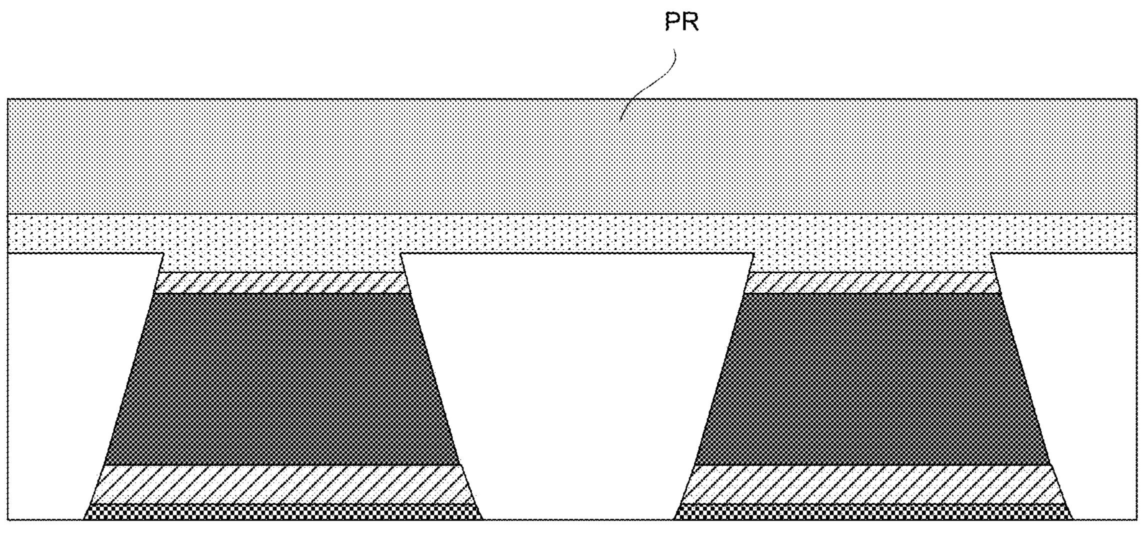
Figure 15:
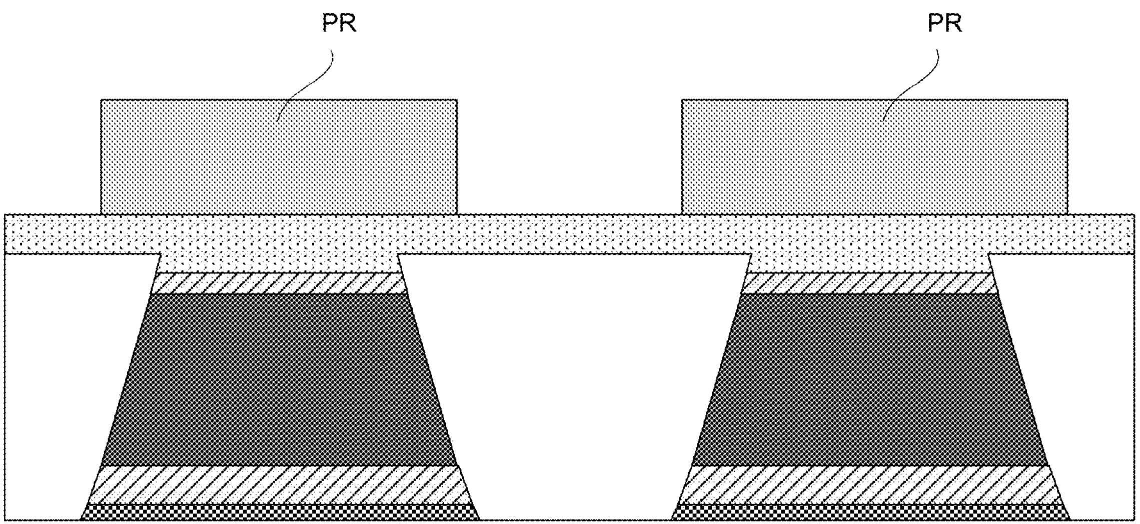
Figure 16:
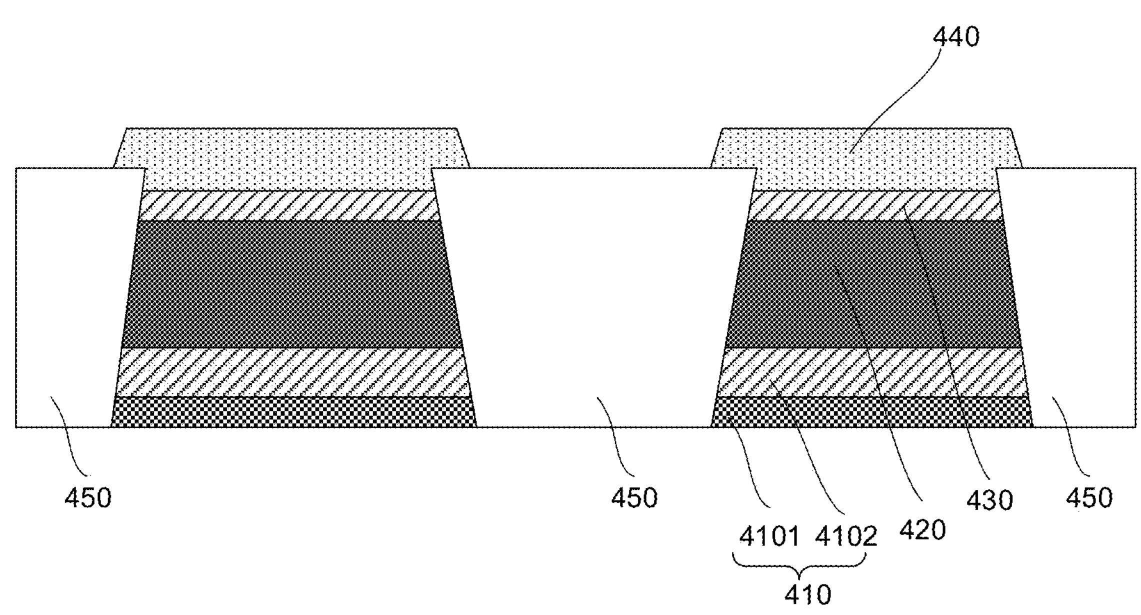

As shown in FIG. 13, a transparent material 4402' is deposited on the structure shown in FIG. 12, for example, ITO with a thickness of about 150 A is deposited by sputtering. Then, as shown in FIG. 14, a photoresist is coated on the structure of FIG. 13. Next, as shown in FIG. 15, the photoresist PR is pixelated to cover the surface of each first electrode material stack structure. Next, the structure of FIG. 15 is etched (e.g. CD is 0.8±0.05 um) to remove the transparent material layer not covered by the photoresist, resulting in the structure shown in FIG. 16. As shown in FIG. 16, the first electrode includes a first conductive layer 410, a metal layer 420, a second conductive layer 430, and a transparent material layer 440. In the gap between adjacent first electrodes, a lateral height coverage layer 450 is provided. It may be seen that the transparent material layer 440 (ITO) may cover the entire first electrode, achieving protection for the first electrode and avoiding metal layer (Al) corrosion during the manufacturing process. Afterwards, a pixel defining layer may be formed on the structure of FIG. 16, so as to obtain the first electrode structure shown in FIG. 4. For example, SiO with a thickness of about 100 A, $SiN_x$ with a thickness of about 600 A, and SiO with a thickness of about 200 A may be deposited in sequence on the structure of FIG. 16 (such as using the chemical vapor deposition method). Then, different etching selection ratios between SiO and SiN& may be used for SiO and $SiN_x$ etching (such as using a photolithography method for etching), so as to achieve the morphology fabrication of the pixel defining layer.

The embodiments of the present disclosure form the first electrode structure by 2D2E (two depositions and two etchings), so that a coating is formed on the edge of the transparent material layer. In combination with the undercut structure of the pixel defining layer, the sidewall of the metal layer of the first electrode is effectively covered, effectively reducing the risk of corrosion on the surface of the first electrode and the sidewall of the metal layer while ensuring the high reflectivity. At the same time, it may suppress the Al migration of the metal layer to improve the point line defect.

Figure 17:
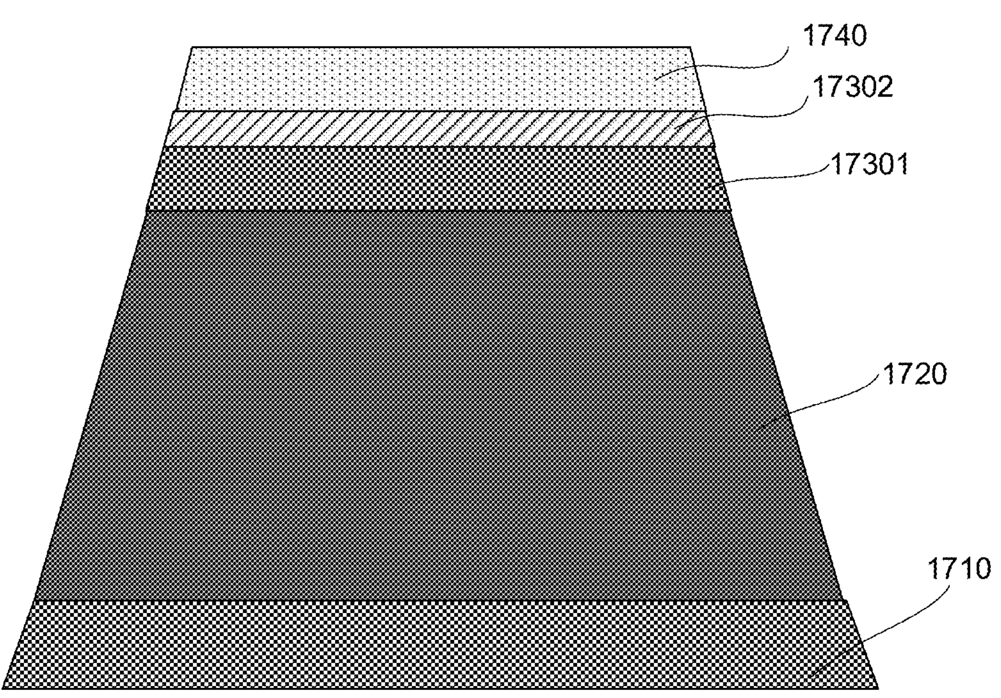
FIG. 17 shows a cross-sectional view of a structure of a first electrode of a sub-pixel according to another embodiment of the present disclosure.

FIG. 17 shows a cross-sectional view of a first electrode structure of a sub-pixel according to another embodiment of the present disclosure. As shown in FIG. 17, the first electrode includes a first conductive layer 1710, a metal layer 1720, a second conductive layer 1730, and a transparent material layer 1740. A material of the first conductive layer 1710 may be Ti or TiN. A material of the metal layer 1720 may be Al. The second conductive layer 1730 is a composite material layer, including a first conductive sub-layer 17301 and a second conductive sub-layer 17302. A material of the first conductive sub-layer 17301 may be Ti, and a material of the second conductive sub-layer 17302 may be TiN. A thickness of the first conductive sub-layer 17301 may be about 30 A, and a thickness of the second conductive sub-layer 17302 may be about 15 A.

Figure 18:
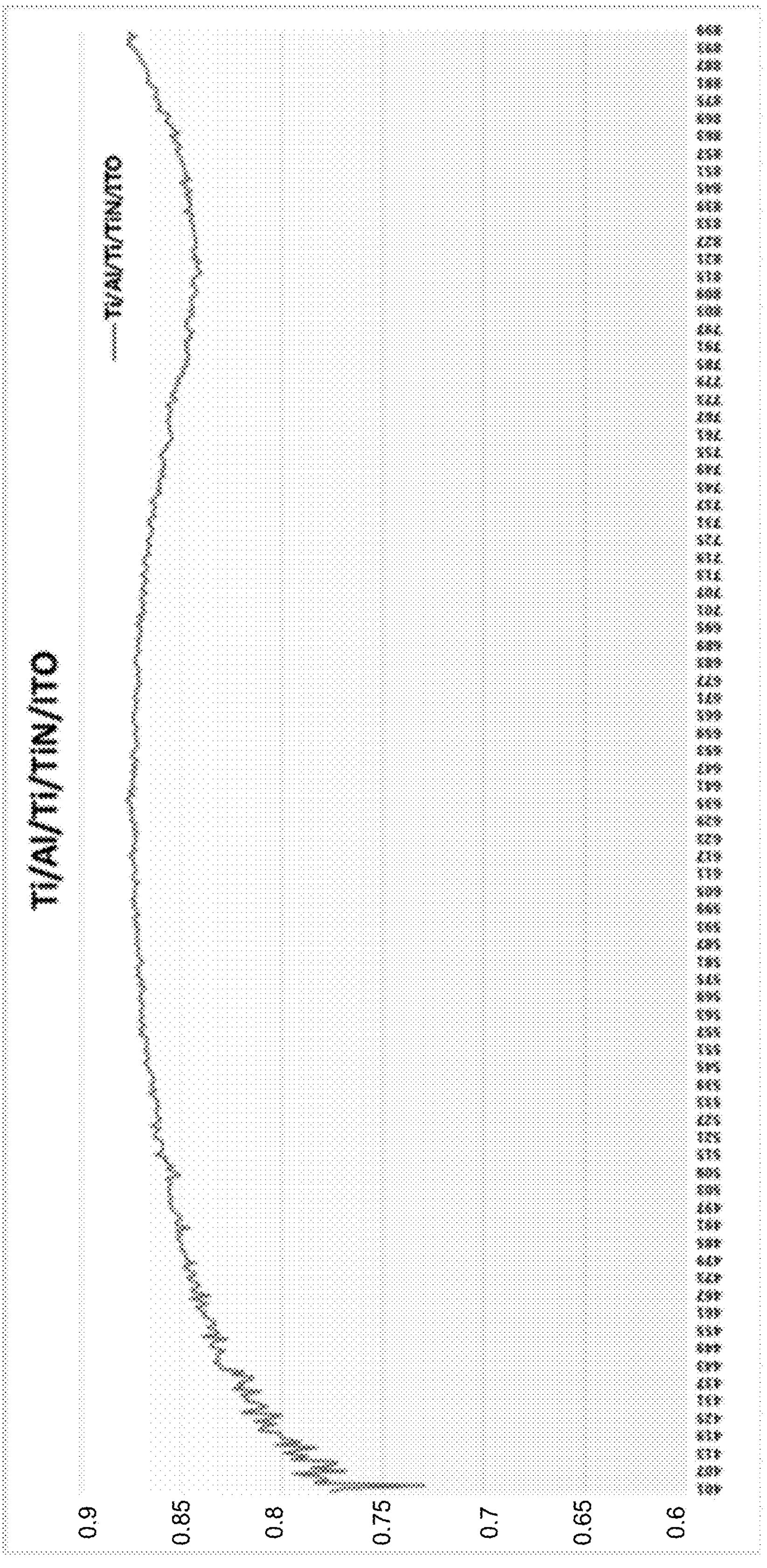
FIG. 18 shows a simulation diagram of a reflectivity of the structure of the first electrode of the sub-pixel shown in FIG. 17.

In some embodiments, a Ti+TiN composite film layer of the second conductive layer 1730 may be fabricated by using a $N_2$ plasma treatment. For example, a Ti layer, an Al layer, and a Ti layer may be deposited in sequence through physical vapor deposition (PVD). Then, a TiN layer is formed on the surface of the Ti layer through the $N_2$ plasma treatment. Next, an ITO layer is deposited on the TiN layer. At this point, the first electrode material coating is completed. A surface of the TiN layer formed in this way is flat, without voids or hillocks. As shown in FIG. 18, a reflectivity of the first electrode structure fabricated in this way is 83.6% @ 460 nm.

In another some embodiments, a PVD TiN cavity may be used to directly deposit the TiN layer. For example, Ti/Al/Ti/TiN/ITO are deposited in sequence through PVD.

A single layer of Ti or TiN is provided on two sides of the Al layer of most of the first electrodes. Ti combined with ITO often has problems such as poor roughness and hillock in the manufacturing process. Although TiN has a good blocking effect, it may cause a loss of reflectivity due to its absorbance. Due to poor adhesion, the first electrode is prone to peeling under a condition of non-strong micro-cavity and thin thickness. A thickness of a TiN metal barrier layer is required to be minimized as much as possible. However, TiN has a poor adhesion, resulting in a weak film density due to thinning. Subsequent manufacturing processes may easily impact the TiN film layer through an ITO pin hole, causing the pin hole and even Al corrosion due to severe peeling.

The embodiments of the present disclosure obtain the first electrode structure of Ti/Al/Ti/TiN/ITO (or TiN/Al/Ti/TiN/ITO) by providing the conductive layer (also referred as the metal barrier layer) above the metal layer as a composite film layer of TiN and Ti. It not only avoids the hillock formed by Ti and ITO, but also avoids the hole caused by the pin hole of ITO and the peeling of the first electrode.

Figure 19:
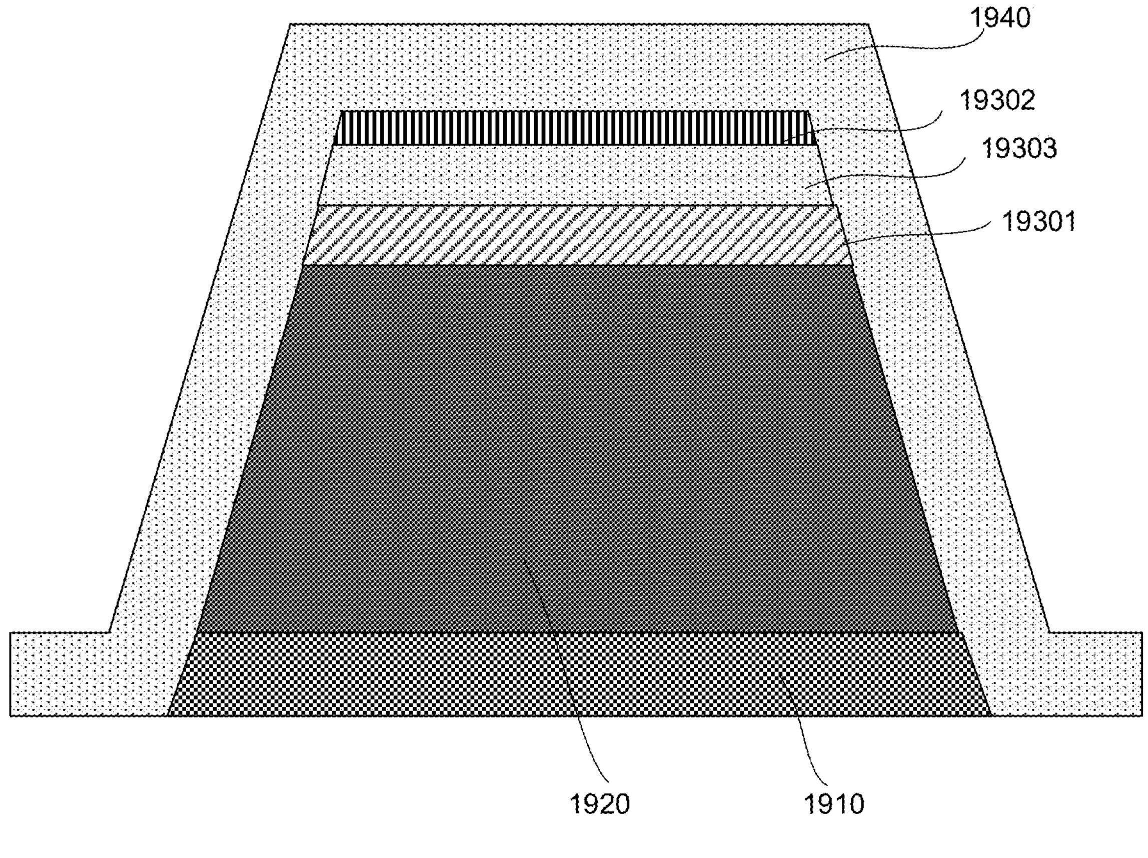
FIG. 19 shows a cross-sectional view of a structure of a first electrode of a sub-pixel according to another embodiment of the present disclosure.

FIG. 19 shows a cross-sectional view of a first electrode structure of a sub-pixel according to another embodiment of the present disclosure. As shown in FIG. 19, the first electrode includes a first conductive layer 1910, a metal layer 1920, a second conductive layer 1930, and a transparent material layer 1940. A material of the first conductive layer 1910 may be Ti or TiN, such as Ti with a thickness of about 100 A. A material of the metal layer 1920 may be Al, with a thickness of about 730 A. The second conductive layer 1930 is a composite material layer, including a first conductive sub-layer 19301 and a second conductive sub-layer 19302. A material of the first conductive sub-layer 19301 of the second conductive layer 1930 may be TiN, with a thickness of about 16 A. A material of the second conductive sub-layer 19302 may be $Al_2O_3$, with a thickness of about 15 A.

In some embodiments, the second conductive layer 1930 further includes a third conductive sub-layer 19303. The third conductive sub-layer 19303 is located between the first conductive sub-layer 19301 and the second conductive sub-layer 19302. A material of the third conductive sub-layer 19303 may be ITO, with a thickness of about 50 A.

In some embodiments, the transparent material layer 1940 covers a stack structure formed by the first conductive layer 1910, the metal layer 1920, and the second conductive layer 1930.

When manufacturing the first electrode structure shown in FIG. 19, Ti(100 A)/Al(730 A)/TiN(15 A)/ITO(50 A) may be deposited in sequence, and then transferred to an ALD device to deposit a layer of $Al_2O_3$ with a thickness of 15 A as a protective layer and a stress matching layer. Then, patterning is achieved through coating, exposure, development, and etching, so as to obtain the first conductive layer 1910, the metal layer 1920, and the second conductive layer 1930 shown in FIG. 19. Afterwards, ITO with a thickness of 150 A may be deposited by magnetron sputtering to obtain the transparent material layer 1940 shown in FIG. 19.

In the fabrication of a silicon-based Micro-OLED device, the film layer on the surface of the first electrode is easily corroded by a cleaning solution after patterned etching to form dense pits on the surface. The pits may transfer in the subsequence manufacturing process resulting in larger roughness, affecting the reflectivity and a hole injection effect. In previous studies, a large number of researchers have focused on the impact of graphical structures on the device, while neglecting the impact of film structures on the improvement of film quality. In the process of manufacturing the first electrode of FIG. 19, Ti/Al/TIN/ITO/$Al_2O_3$ are sputtered in sequence, followed by patterned etching. After etching and cleaning with the cleaning solution, the ITO layer is not corroded. $Al_2O_3$ has a strong corrosion resistance which is not easily corroded, and a surface damage of $Al_2O_3$ is relatively small after cleaning. Then the ITO layer is deposited to match a required work function for hole injection. In this way, the surface roughness caused by the manufacturing process is greatly improved. In addition, as an inter-diffusion barrier layer of Al and ITO, the TiN layer has a high stress, which may match the stress after depositing $Al_2O_3$, thereby reducing the risk of peeling of the film layer.

It should be noted that in the above description, the technical solution of the embodiments of the present disclosure is shown only by example, but it does not mean that the embodiments of the present disclosure are limited to the steps and structures mentioned above. Wherever possible, adjustments and trade-offs may be made to the steps and structures as needed. Therefore, certain steps and units are not essential elements for implementing the overall inventive concept of the embodiments of the present disclosure.

The present disclosure has been described in conjunction with preferred embodiments. It should be understood that those skilled in the art may make various other changes, replacements, and additions without departing from the spirit and scope of the embodiments of the present disclosure. Therefore, the scope of the embodiments of the present disclosure is not limited to the specific embodiments mentioned above, but should be limited by the accompanying claims.

What is claimed is:

1. A display substrate, comprising a base substrate and a plurality of sub-pixels disposed on the base substrate, wherein the sub-pixel comprises:

a light-emitting element having a first electrode, a second electrode, and a light-emitting layer located between the first electrode and the second electrode, wherein the first electrode comprises a transparent material layer; and a pixel defining layer located on a side of the first electrode away from the base substrate, wherein the pixel defining layer has an opening, an edge of the pixel defining layer has an undercut structure, a center of the transparent material layer is exposed from the opening, and an edge of the transparent material layer is covered by the pixel defining layer, wherein the pixel defining layer comprises a first pixel defining sub-layer and a second pixel defining sub-layer, wherein the second pixel defining sub-layer covers the first pixel defining sub-layer and forms the undercut structure with the first pixel defining sub-layer, and a thickness of the first pixel defining sub-layer is greater than a thickness of the second pixel defining sub-layer; and wherein the pixel defining layer comprises a first region close to the undercut structure and a second region connected to the first region and away from the undercut structure, with a thickness of the first region greater than a thickness of the second region.

2. The display substrate according to claim 1, wherein a width of the undercut structure of the pixel defining layer in a direction parallel to the base substrate is greater than a difference between a thickness of a part of the pixel defining layer covering the transparent material layer and a thickness of a part of the pixel defining layer not covering the transparent material layer.

3. The display substrate according to claim 1, wherein a width of each of the first region and the second region in a direction parallel to the base substrate is greater than a width of the undercut structure in the direction parallel to the base substrate.

4. The display substrate according to claim 1, wherein a width of the first region in a direction parallel to the base substrate is smaller than a width of the second region in the direction parallel to the base substrate.

5. The display substrate according to claim 1, wherein the first electrode further comprises a metal layer and a second conductive layer, wherein the transparent material layer is electrically connected to the metal layer through the second conductive layer, the transparent material layer is made of ITO, the metal layer is made of Al, and the second conductive layer is made of TiN.

6. The display substrate according to claim 5, wherein a thickness of the second conductive layer is smaller than a thickness of the transparent material layer.

7. The display substrate according to claim 1, wherein a thickness of a part of the transparent material layer not covered by the pixel defining layer is less than a thickness of a part of the transparent material layer covered by the pixel defining layer.

8. The display substrate according to claim 5, wherein the first electrode further comprises a first conductive layer located on a side of the metal layer close to the base substrate, wherein the first conductive layer comprises a first conductive sub-layer and a second conductive sub-layer, the second conductive sub-layer is located on a side of the first conductive sub-layer away from the base substrate, and a material of the first conductive sub-layer of the composite material layer and a material of the second conductive sub-layer of the composite material layer are Ti and TiN respectively.

9. The display substrate according to claim 8, wherein a thickness of the second conductive layer is less than a thickness of the second conductive sub-layer of the first conductive layer.

10. The display substrate according to claim 1, wherein a gap between adjacent first electrodes is filled with a lateral height coverage layer, and a material of the lateral height coverage layer is $SiO_x$ or $Al_2O_3$.

11. The display substrate according to claim 10, wherein a surface of the lateral height coverage layer on a side of the lateral height coverage layer away from the base substrate is higher than a surface of the second conductive layer on a side of the second conductive layer away from the base substrate;

wherein an edge of the transparent material layer is tilted towards the light-emitting layer and covers an edge of the lateral height coverage layer;

wherein a slope angle of a sidewall of the lateral height coverage layer towards the first electrode in a direction parallel to the base substrate is less than a slope angle of a sidewall of the opening of the pixel defining layer.

12. The display substrate according to claim 1, further comprising: a protective layer located between first pixel defining sub-layers of adjacent sub-pixels, wherein a thickness of the protective layer is less than the thickness of the second pixel defining sub-layer.

13. The display substrate according to claim 1, wherein a part of the pixel defining layer covering the transparent material layer is located in the second region of the pixel defining layer, a part of the pixel defining layer not covering the transparent material layer is located in the first region of the pixel defining layer, a thickness of the first region is greater than a thickness of a part of the transparent material layer exposed from the opening of the pixel defining layer, and a surface of the pixel defining layer in the second region away from the base substrate is higher than a surface of the transparent material layer away from the base substrate.

14. The display substrate according to claim 1, wherein an inclination angle of the undercut structure of the pixel defining layer is less than a slope angle of a sidewall of the opening of the pixel defining layer.

15. The display substrate according to claim 1, wherein the transparent material layer comprises a first transparent material sub-layer and a second transparent material sub-layer, the first transparent material sub-layer is located between the second transparent material sub-layer and a second conductive layer, the second transparent material sub-layer covers the first transparent material sub-layer, and an edge of the first transparent material sub-layer is aligned with an edge of the second conductive layer.

16. The display substrate according to claim 15, wherein a surface roughness of the second transparent material sub-layer is less than a surface roughness of the first transparent material sub-layer;

wherein a thickness of the second transparent material sub-layer is greater than a thickness of the first transparent material sub-layer.

17. The display substrate according to claim 1, wherein the thickness of the second pixel defining sub-layer is less than a thickness of a part of the transparent material layer covering the lateral height coverage layer;

wherein the thickness of the first pixel defining sub-layer is greater than a thickness of a part of the transparent material layer covering the lateral height coverage layer.

18. The display substrate according to claim 1, wherein at the opening of the pixel defining layer, a part of the second pixel defining sub-layer covering the first pixel defining sub-layer extends to the transparent material layer;

wherein the undercut structure of the pixel defining layer has a projection on the lateral height coverage layer, and a thickness of an edge part of the lateral height coverage layer within the projection is greater than a thickness of a center part of the lateral height coverage layer outside the projection.

19. A method of manufacturing a display substrate, the display substrate comprising a base substrate and a plurality of sub-pixels disposed on the base substrate, wherein the sub-pixel comprises: a light-emitting element having a first electrode, a second electrode, and a light-emitting layer located between the first electrode and the second electrode, wherein the first electrode comprises a transparent material layer; and a pixel defining layer located on a side of the first electrode away from the base substrate, wherein the pixel defining layer has an opening, an edge of the pixel defining layer has an undercut structure, a center of the transparent material layer is exposed from the opening, and an edge of the transparent material layer is covered by the pixel defining layer, wherein the pixel defining layer comprises a first pixel defining sub-layer and a second pixel defining sub-layer, wherein the second pixel defining sub-layer covers the first pixel defining sub-layer and forms the undercut structure with the first pixel defining sub-layer, and a thickness of the first pixel defining sub-layer is greater than a thickness of the second pixel defining sub-layer; and wherein the pixel defining layer comprises a first region close to the undercut structure and a second region connected to the first region and away from the undercut structure, with a thickness of the first region greater than a thickness of the second region;

wherein the method comprising: for each sub-pixel, forming, on the base structure, the first electrode of the light-emitting element of the sub-pixel, the light-emitting layer of the light-emitting element of the sub-pixel, the pixel defining layer, and the second electrode of the light-emitting element of the sub-pixel in sequence.

20. The method of claim 19, wherein forming the first electrode of the light-emitting element comprises:

forming, by a first deposition and etching, a first conductive layer, a second conductive layer, and a first transparent material sub-layer of the transparent material layer of the light-emitting element on the substrate structure;

forming, by a second deposition and etching, a second transparent material sub-layer of the transparent material layer on the first transparent material sub-layer, such that the second transparent material sub-layer covers the first transparent material sub-layer, and an edge of the first transparent material sub-layer is aligned with an edge of the second conductive layer.

* * * * *